(12) United States Patent
Seyyedy et al.

(10) Patent No.: US 6,976,195 B1
(45) Date of Patent: Dec. 13, 2005

(54) METHOD AND APPARATUS FOR TESTING A MEMORY DEVICE WITH COMPRESSED DATA USING A SINGLE OUTPUT

(75) Inventors: Mirmajid Seyyedy, Boise, ID (US); Mark R. Thomann, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/239,898

(22) Filed: Jan. 29, 1999

(51) Int. Cl.[7] ............................................. G11C 29/00
(52) U.S. Cl. ...................... 714/718; 710/68; 710/74; 375/287; 341/56
(58) Field of Search ................ 714/718, 722, 714/731, 733, 784, 745, 710, 7, 719; 710/36, 68, 74, 105; 386/2, 47, 13, 85, 113, 21; 365/230.108, 200–201, 233, 220, 221, 189.8, 189.08, 193, 187.01; 326/101–103; 375/287; 360/24, 47, 56; 341/56; 324/210

(56) References Cited

U.S. PATENT DOCUMENTS

| | | | |
|---|---|---|---|
| 5,231,605 A | 7/1993 | Lee | 365/201 |
| 5,754,559 A | 5/1998 | Nevill | 371/22.1 |
| 5,787,096 A | 7/1998 | Roberts et al. | 371/21.1 |
| 5,787,097 A | 7/1998 | Roohparvar et al. | 371/21.5 |
| 5,809,038 A | 9/1998 | Martin | 371/21.2 |
| 5,864,565 A * | 1/1999 | Ochoa et al. | 714/735 |
| 5,991,232 A * | 11/1999 | Matsumura et al. | 365/201 |
| 6,032,274 A * | 2/2000 | Manning | 714/718 |
| 6,297,668 B1 * | 10/2001 | Schober | 326/101 |
| 6,324,602 B1 * | 11/2001 | Chen et al. | 341/56 |

OTHER PUBLICATIONS

"16Mb Double Data Rate Synchronous Graphics RAM", *IBM Corporation*, IBM0616328RL6A,(Dec. 1997),pp. 1–53.

"16Mbit DDR SGRAM, 128K×32Bit×4 Banks Double Data Rate Synchronous Graphic RAM with Bi-directional Data Strobe, Revision 0.6", *Samsung Electronics*, KM432D5131, (Apr. 1998),pp. 1–48.

* cited by examiner

*Primary Examiner*—Guy Lamarre
(74) *Attorney, Agent, or Firm*—Schwegman, Lundberg, Woessner & Kluth, P.A.

(57) ABSTRACT

A method and apparatus for testing a memory device with compressed data using multiple clock edges is disclosed. In one embodiment of the present invention data is written to cells in a memory device, the cells are read to generate read data, the read data is compressed to generate test data, and the test data is produced at a single output on edges of a clock signal.

32 Claims, 7 Drawing Sheets

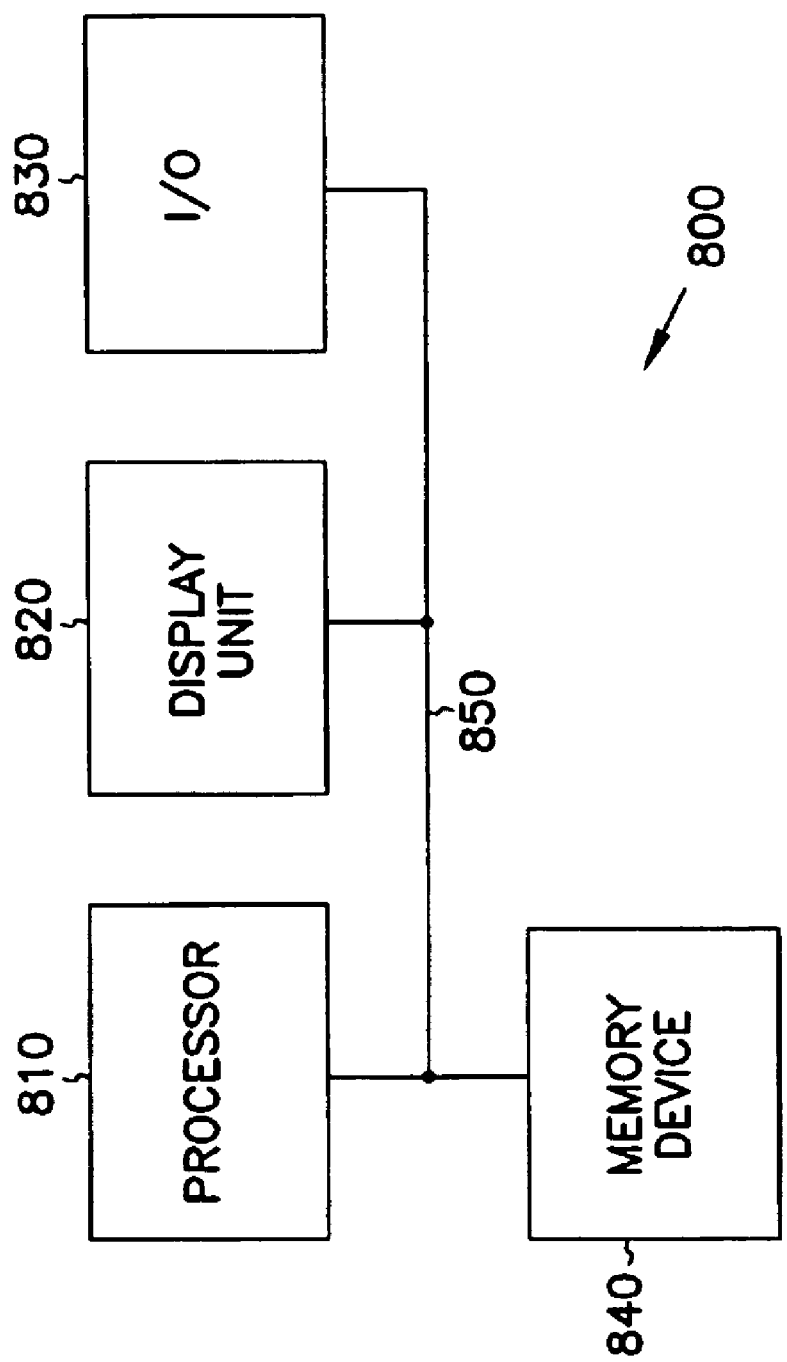

METHOD AND APPARATUS FOR TESTING A MEMORY DEVICE WITH COMPRESSED DATA USING A SINGLE OUTPUT

FIELD OF THE INVENTION

The present invention relates to memory devices, and more particularly, to a method and apparatus for testing a memory device with compressed data using a single output.

BACKGROUND

An integrated circuit comprises a large number of semiconductor devices, such as transistors and capacitors, that are fabricated in a dense pattern on a semiconductor substrate. Groups of integrated circuits are fabricated on a single wafer of semiconductor material, and a very large number of devices are fabricated on each wafer. Typically many of the devices on a wafer contain defects which render a portion of the integrated circuits unsalable, so each integrated circuit must be tested before being shipped to a customer.

Different types of integrated circuits are tested in different ways. Integrated circuit memory devices are tested in groups, for example four or more at a time, by a single automatic test machine. The memory devices contain arrays of memory cells arranged in rows and columns The test machine writes data to the cells in a pattern and then reads the data from the cells. If a the data read from a cell is different from the data that was written to it, the cell is defective. Most memory devices contain redundant cells that are used to replace cells discovered to be defective in such a test.

The process of writing data to and reading data from each cell in a memory device is extremely time consuning and a costly part of the fabrication process. Most methods of testing memory devices read data from a large number of cells and then compress the read data before evaluating the results of the test. The data is compressed in a dedicated test circuit in the memory device that is used only during the test. In a typical test sequence all 1's or all 0's are written to a pattern of cells in the memory device and if all of the tested cells are operating properly the read data will be all 1's or all 0's. However, if one or more of the cells malfunctions the read data will have both 1's and 0's. The test circuit will output a 1 to a selected data pin if the read data is all 1's, and will output a 0 to the data pin if the read data is all 0's. If the read data contains 0's and 1's the data pin is tri-stated by the test circuit. Waiting for the tri-state output to settle, or in other words waiting for the data pin to reach a high-impedance state, adds a significant amount of time to the test process. Even with the use of compressed data a test of a single memory device is time consumng and costly.

There is a need for faster methods of testing integrated circuit memory devices to reduce the cost of fabricating such devices.

SUMMARY OF THE INVENTION

The above mentioned and other deficiencies are addressed in the following detailed description of embodiments of the present invention. According to one embodiment of the present invention data is written to cells in a memory device, the cells are read to generate read data, the read data is compressed to generate test data, and the test data is produced at a single output on edges of a clock signal. Advantages of the present invention will be apparent to one sldllled in the art upon an examinaton of the detailed description of the embodiments of the present invention.

BRIEF DESCRIPTION OF THE DRAWINGS

FIG. 8 is a block diagram of an information handling system according to an embodiment of the present invention.

DETAILED DESCRIPTION OF THE PREFERRED EMBODIMENTS

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

In this description transistors will be described as being in an active state or switched on when they are rendered conductive by an appropriate control signal, and the transistors will be described as being in an inactive state or switched off when they are rendered nonconductive by the control signal.

Figure 1:
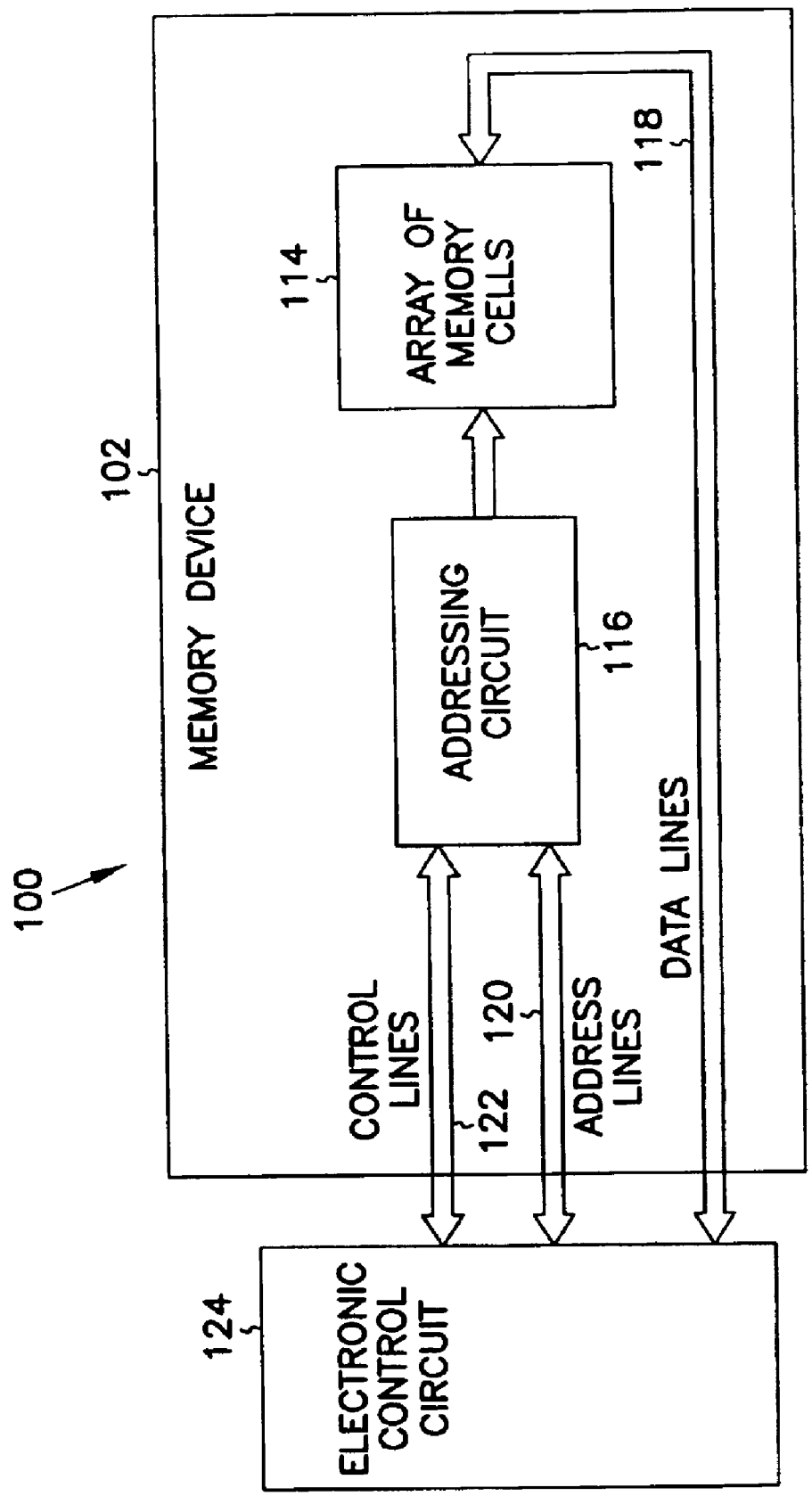
FIG. 1 is a block diagram of a memory system according to an embodiment of the pesent invention.

Memory devices are tested and opera(ed in conjunction with an electronic control circuit. FIG. 1 is a block diagram a memory system 100 according to an embodiment of the present invention. The memory system 100 includes a memory device 102 having an amay 114 of memory cells. An addressing circuit 116 is coupled to the array 114 to select cells for reading or writing data. The array 114 receives data from and provides data to a set of data lines 118. Addresses are provided to the, addressing circuit 116 over a set of address lines 120, and control signals are provided to the addressing circuit 116 over a set of control lines 122 to control the operation of the memory device 102. The memory device 102 is coupled to an electronic control circuit 124 through the data lines 118, the address lines 120, and the control lines 122. The control circuit 124 may be a processor or a test control circuit coupled to test the memory device 102. The data, address, and control lines 118, 120, 122 form a bus outside the memory device 102, and the bus is connected to the memory device 102 through a set of external pins. The control circuit 124 governs a test of the memory device 102 by providing write data, addresses, and control signals over the data, address, and control lines 118, 120, 122, respectively, to the memory device 102. During the test the memory device 102 returns read data to the control circuit 124 over the data lines 118.

The memory device 102 is tested by writing a single test data value to a plurality of selected cells in the array 114. Those skilled in the art will understand that this is typically done by converting one bit into a plurality of bits through a dedicated circuit and writing the bits to the selected cells. Data is then read from the selected cells to determine if the read data is the same as the test data value. A single test data value, either a 1 or a 0, is used to speed the test by enabling a rapid analysis of the read data. If the memory device 102 is operating properly the read data will be either all 1's or all 0's.

In one embodiment of the present invention the array 114 is divided into as many as 256 subarrays of cells. The test data value is written to a selected cell in each of 16 of the subarrays so that the change in each selected cell does not interfere with the writing to other selected cells. The selected cells are then read to generate 16 read data values. The read data values are compressed to generate one or more compressed data signals that are analyzed to determine if the read data values are the same as the test data value. The compression of the read data values reduces the time necessary to test the memory device 102 because the read data values do not have to be analyzed individually. Dedicated test circuitry is provided in either the memory device 102 or the control circuit 124 to carry out the compression of the read data values. The test is repeated for different groups of selected cells until all of the cells in the array 114 have been tested. In alternative embodiments of the present invention the test is repeated for different groups of cells until both a 0 and a 1 have been written to and read from all of the cells in the array 114. This may be accomplished by writing 0's and 1's to the cells in a checkerboard pattern, or by using other patterns known to those skilled in the art.

Figure 2:
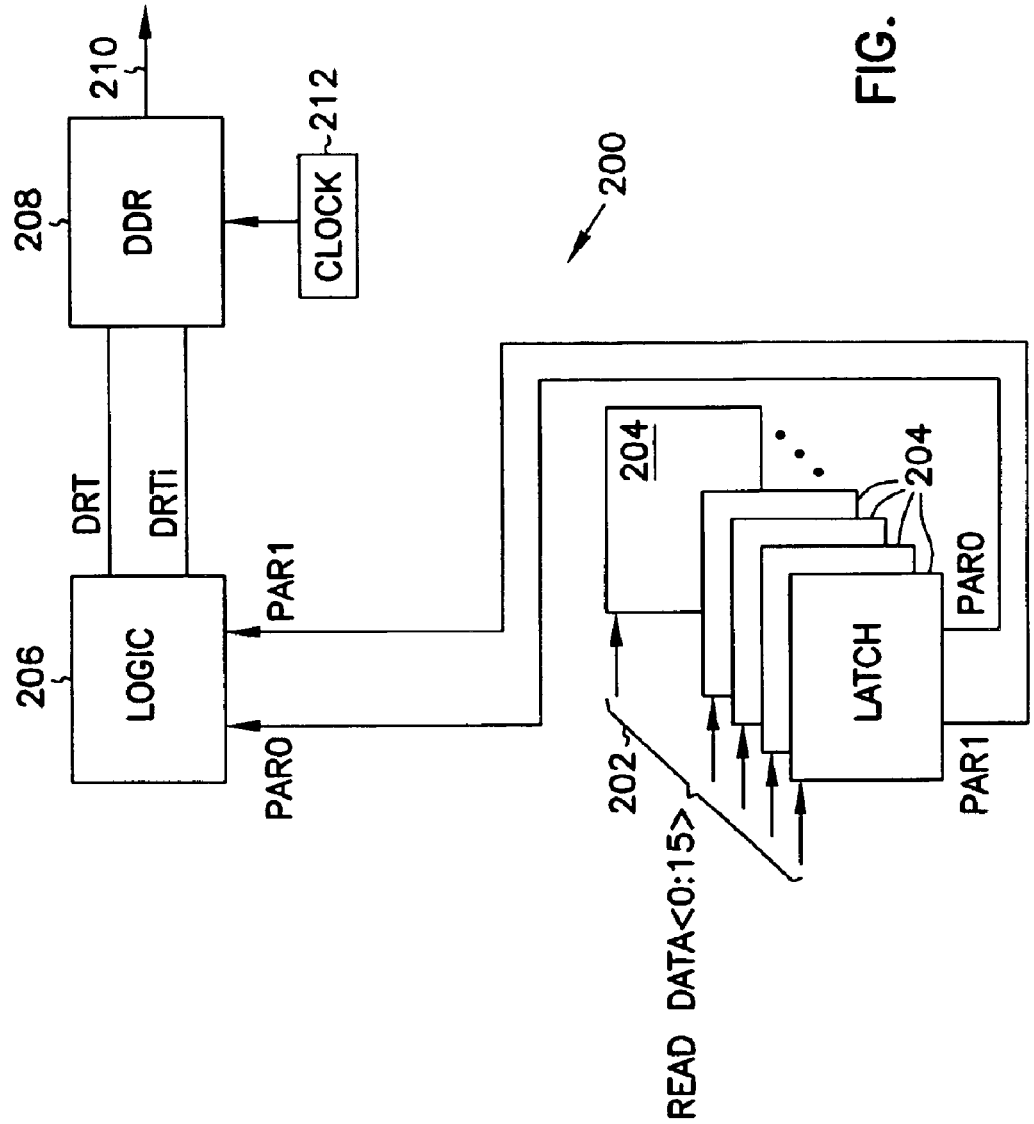
FIG. 2 is a block diagram of a test circuit according to an embodiment of the present invention.

A test circuit 200 according to an embodiment of the present invention is shown in FIG. 2. The test circuit 200 compresses the read data values from the memory device 102 provided on sixteen read data paths 202 during the test. Each of the read data paths 202 includes a respective latch circuit 204 that holds the read data value for a short period of time. The read data paths 202 and the latch circuits 204 are used during a non-test operation of the memory device 102 to transfer data from the cells in the array 114 to respective output pins. Two intermediate signals PAR0 and PAR1 are generated in a circuit connecting the latch circuits 204 based on the read data values. The signals PAR0 and PAR1 are coupled to a logic circuit 206 in which they are manipulated to generate two compressed data signals DRT and DRTi provided at two outputs of the logic circuit 206. The logic circuit 206 is structured to generate the signals DRT and DRTi to be equal to the read data values if the read data values are all the same, and to be different from each other if the read data values include both 0's and 1's. The signals DRT and DRTi are provided to a double data rate (DDR) circuit 208 that combines the signals DRT and DRTi into a single test output signal at a pin 210. The DDR circuit 208 receives a clock signal from a clock signal source 212 and alternately couples the signals DRT and DRTi to the pin 210 on successive edges of the clock signal. For example, in a single period of the clock signal the signal DRT is coupled to the pin 210 on the rising edge and the signal DRTi is coupled to the pin 210 on the falling edge of the clock signal.

The test output signal is strobed by the control circuit 124 with either an edge strobe or a window strobe. If the test data value is 0 and all the read data values are 0 then the signals DRT and DRTI are both 0, the test output signal is low, and the selected cells have successfully stored and produced the test data value. If the test data value is 1 and all the read dat values are 1 then the signals DRT and DRTi are both 1, the test output signal is high, and the selected cells have successfully stored and produced the test data value. However, if the read data values are 0's and 1's then the signals DRT and DRTi are different, the test output signal toggles between high and low over one period of the clock signal, and some of the selected cells have failed to store the test data properly. The control circuit 124 then replaces the failed cells according to methods known to those skilled in the art.

The test circuit 200 is coupled to the read data paths 202 in the array 114 and may be located in the array 114, somewhere else in the memory device 102, or in the control circuit 124.

Several implementations of the DDR circuit 208 ame known to those skilled in the art. At least two different types of a DDR synchronous dynamic random-access memory (SDRAM) and a synchronous graphics random-access memory (SGRAM) have been proposed. A first standard for DDR SDRAM(SGRAM has been implemented by Samsung Electronics Co., of Suwon, South Korea, in its KM432D5131 DDR SGRAM, a data sheet for which, Revision 0.6 (April 1998) has been published. A second standard has been agreed to by the members of the Joint Electronic Device Engineering Council (JEDEC). An example of a DDR SDRAM/SGRAM according to this latter standard is the IBM DDR SGRAM IBM0616328RL6A, manufactured by International Business Machines (IBM), Inc., of White Plains, N.Y., a data sheet for which, #06L6370-02 (12/97), has been published.

Figure 3:
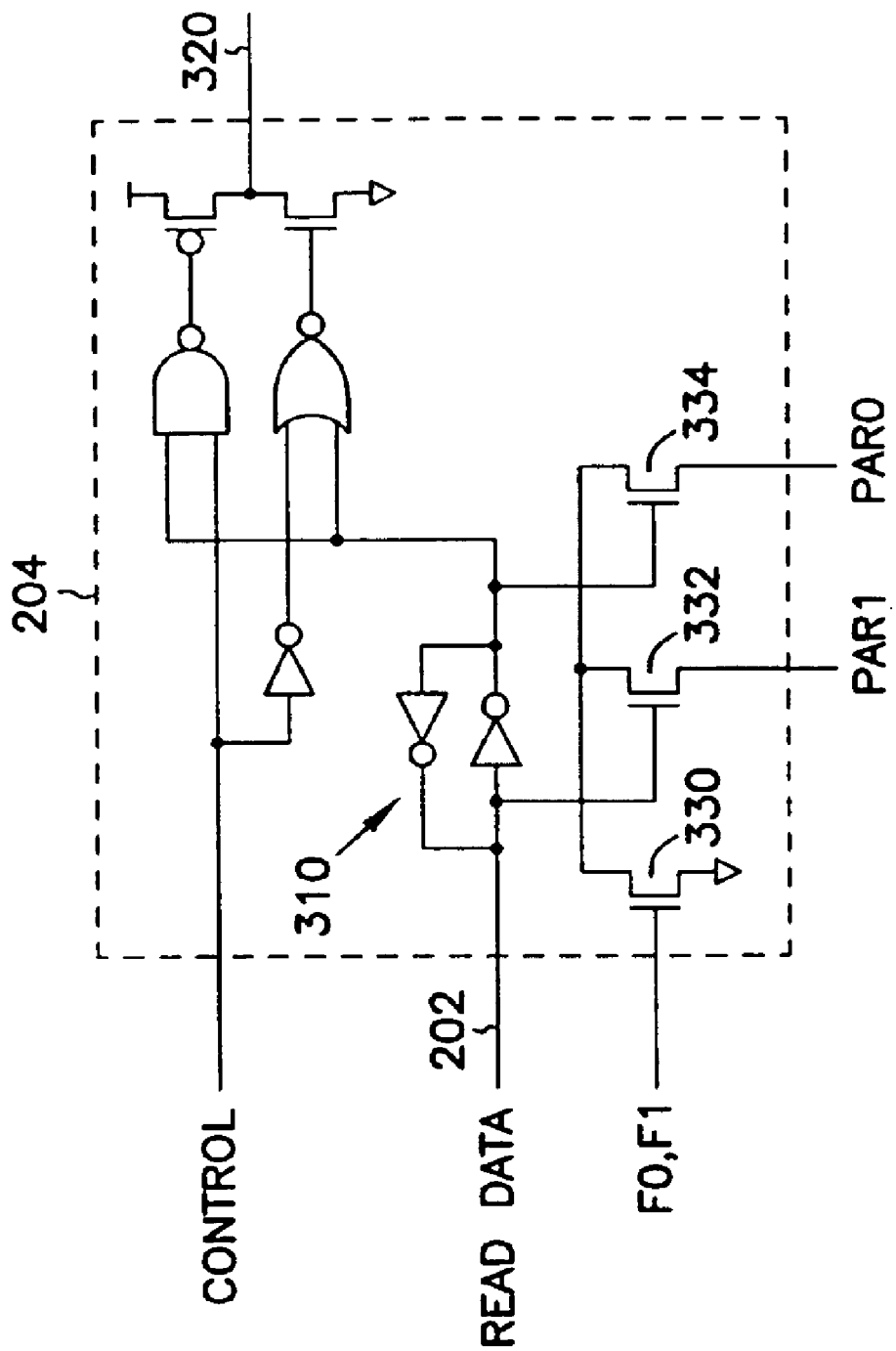
FIG. 3 is an electrical schematic diagram of a latch circuit shown in the test circuit of FIG. 2 according to an embodiment of the present invention.
Figure 4:
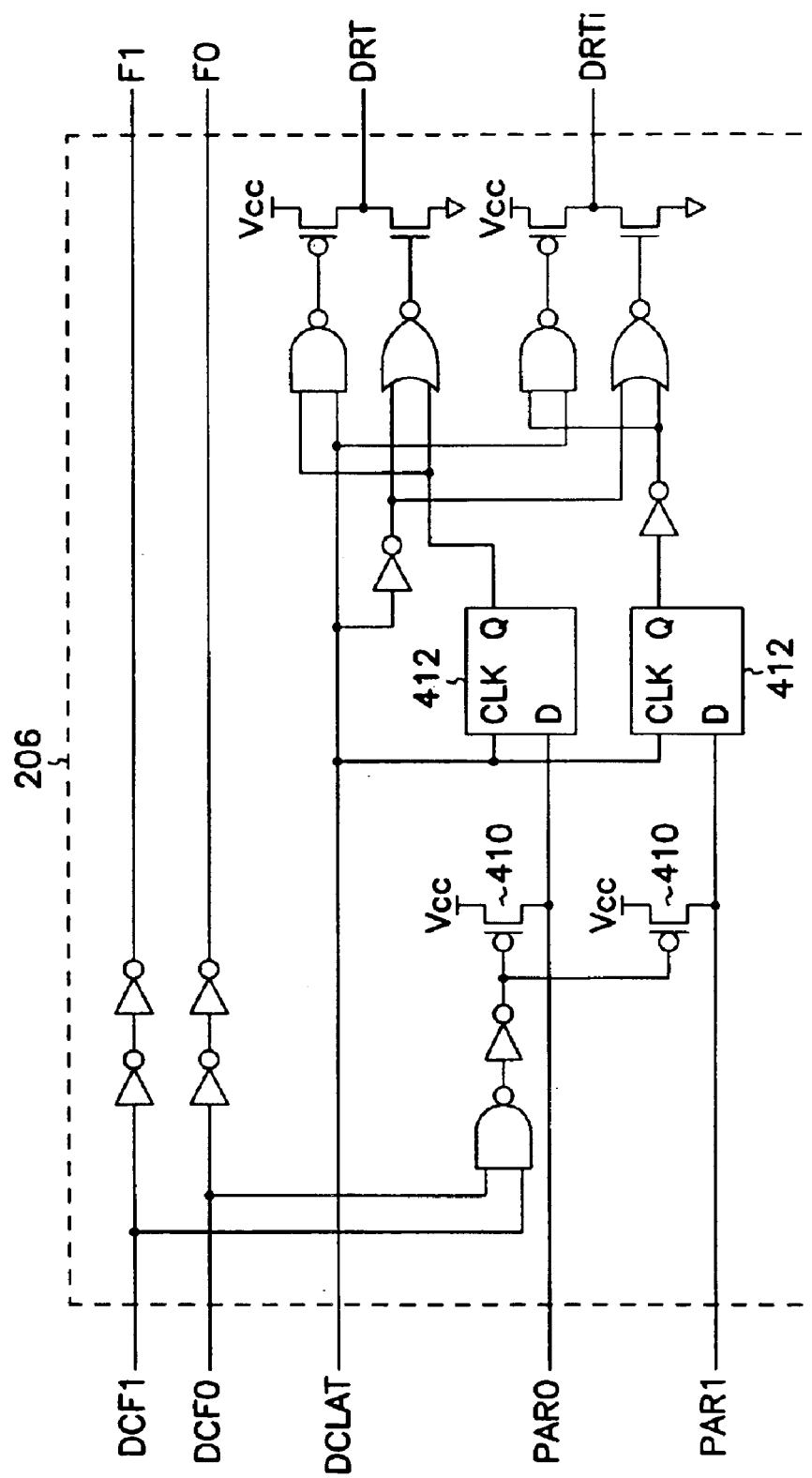
FIG. 4 is an electrical schematic diagram of a logic circuit shown in the test circuit of FIG. 2 according to an embodiment of the present invention.

A detailed electrical schematic diagram of one of the latch circuits 204 is shown in FIG. 3, and a detailed electrcal schematic diagram of the logic circuit 206 is shown in FIG. 4 according to an embodiment of the present invention. The structure and operation of these circuits will be described together. Elements shown in FIG. 2 retain the reference characters shown in FIG. 2.

The latch circuit 204 is part of the read data path 202 on which is provided a read data value from a cell in the array 114. The read data value is latched by a pair of inverters 310. The latch circuit 204 is used when the memory device 102 is operating in a non-test mode to output the read data value to a pin 320. The inverters 310 are connected to a set of N-channel pull-down transistors 330, 332, 334 that compress the read data values latched in the sixteen latch circuits 204 shown in FIG. 2 into the signals PAR0 and PAR1. A control signal is also provided to the latch circuit 204. The operation of the pull down transistors 330, 332, 334 will be explained with reference to the logic circuit 206.

Two control signals DCF0 and DCF1 are provided to the logic circuit 206 to rcontrol the compression of the read data values. The signals DCF0 and DCF1 are normally low such that two P-channel pull-up transistors 410 are switched on to raise the voltage of lines carrying the signals PAR0 and PAR1. The signals DCF0 and DCF1 are used to generate two more control signals F0 and F1 through a set of inverters, and the signals F0 and F1 are coupled to control terminals of a number of pull-down transistors including the pull-down transistor 330 in the latch circuit 204.

The logic circuit 206 generates the signals DRT and DRTi in the following manner. When the signals DCF0 and DCF1 are low the lines carying the signals PAR0 and PAR1 are high and a read data value is latched by the inverters 310. Next, the signals DCF0 and DCF1 are brought high to switch off the transistors 410 and the signals F0 and F1 switch on the transistor 330. The read data value latched by the inverters 310 causes one of the transistors 332, 334 to be switched on and the other to be switched off such that PAR0 and PAR1 have different values. The transistor 332, 334 that is switched on is coupled to ground through the transistor 330 to discharge its respective line. Meanwhile a clock signal DCLAT in the logic circuit 206 causes two flip flop circuits 412 to latch the signals PAR0 and PAR1 before the signals DCF0 and DCF1 are returned to low. Additional logic circuitry shown in FIG. 4 generates the signals DRT and DRTi from the signals PAR0 and PAR1 latched in the flip-flop circuits 412 in a manner known to those skilled in the art.

As shown in FIG. 2, the latch circuits 204 and the logic circuit 206 operate to compress read data values from up to 16 read data paths 202, and the generation of the signals DRT and DRTi will now be explained in more detail. When the mad data values held by the inverters 310 in the latch circuits 204 are all the same, for example 0 or 1, only one of the transistors 332, 334 will be switched on to bring one of the signals PAR0, PAR1 low while the other remains high when the transistor 330 is switched on. The logic circuit 206 subsequently generates the signals DRT and DRTi to be both 1 if all the read data values are 1 and to be both 0 if all the read data values are 0. However, if the read data values are not all the same then both of the transistors 332, 334 will be switched on to bring both signals PAR0, PAR1 low. This due to the fact that each read data value is inverted by the inverters 310 and a 1 is applied to the control terminal of each of the transistors 332, 334 by at least one of the latch circuits 204. When both PAR0 and PAR1 are low the logic circuit 206 generates the signal DRT to be low and the signal DRTi to be high. The signals DRT and DRTi are then combined in the DDR circuit 208 and analyzed as described above with reference to FIG. 2.

The signals DCF0 and DCF1 may be manipulated to limit the above-described procedure to 8 read data values for 8 cells instead of the 16 read data values described above. If 8 cells are tested at a time instead of 16 and one is found defective then fewer cells need to be replaced with redundant cells. However, a test of 8 cells at a time is slower than a test of 16 cells at a time.

Figure 5:
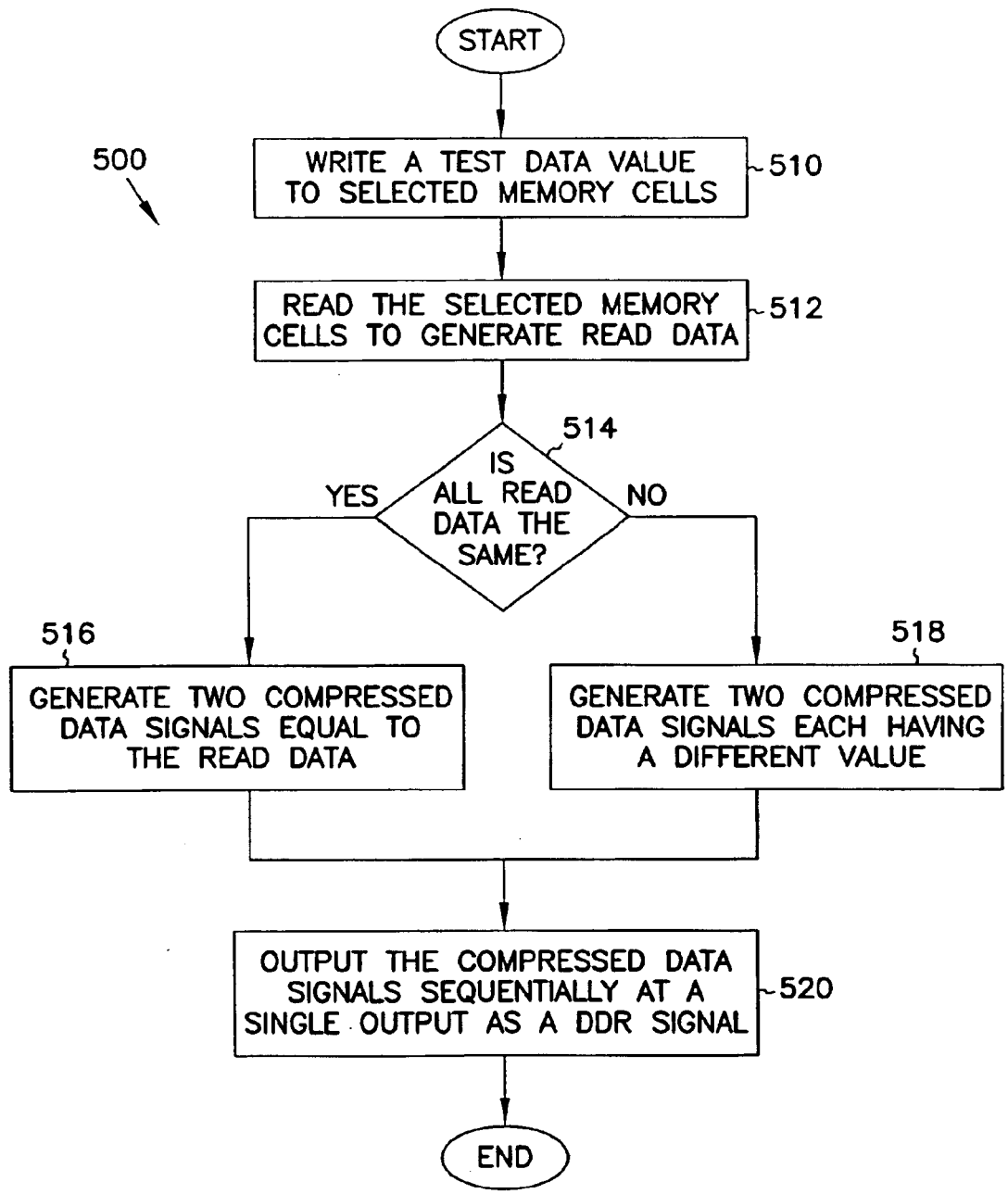
FIG. 5 is a flow chart of a method for testing a memory device according to an embodiment of the present invention.

A flowchart of a method 500 for testing the memory device 102 according to an embodiment of the present invention is shown in FIG. 5. A test data value is written to selected cells in the memory device 102 in step 510 and the selected cells are read in step 512 to generate read data. In step 514 the read data is analyzed and if all the read data is the same then two compressed data signals are generated in step 516 to be equal to the read data. However, if the read data is not all the same then two compressed data signals are generated in step 518 having different values. In step 520 the two compressed data signals, generated either in step 516 or step 518, are output sequentially at a single output as a DDR signal.

Figure 6:
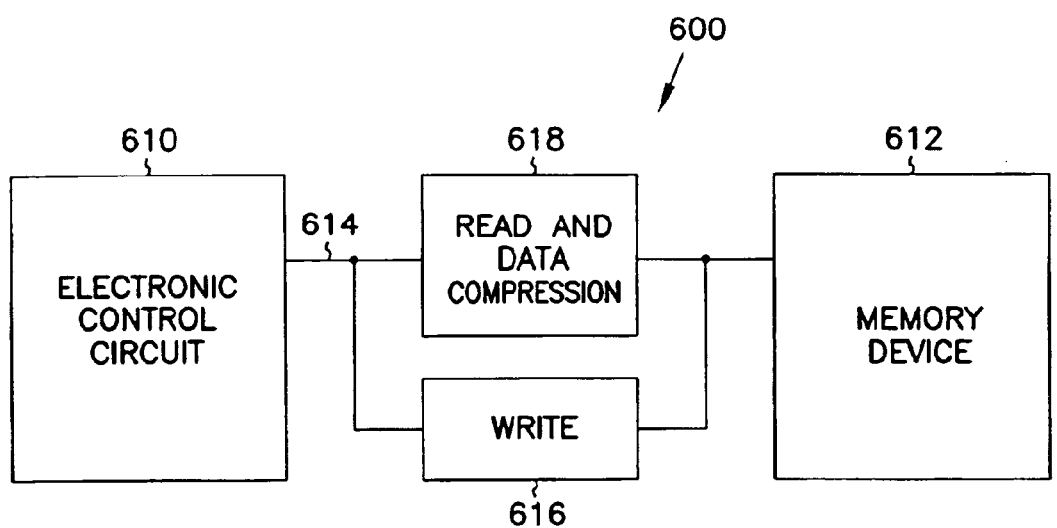
FIG. 6 is a block diagram of a system for implementing the method shown in FIG. 5 according to an embodiment of the present invention.

The method 500 may be implemented as a series of programmable instructions stored and executed in the control circuit 124. lhe method 500 may also be implemented in hardware by a system 600 shown in FIG. 6. The system 600 includes an electronic control circuit 610, a memory device 612, a bus 614, a write circuit 616, and a read and data compression circuit 618. The system 600 may include one or more of the following; hardwired logic, a Field Programmable Gate Array (FPGA), a hardwired FPGA, programmable logic, a programmable microcontroller, an Application Specific Integrated Circuit (ASIC), a Read Ondy Memory (ROM), or a sequencer, or any suitable combination thereof.

Figure 7:
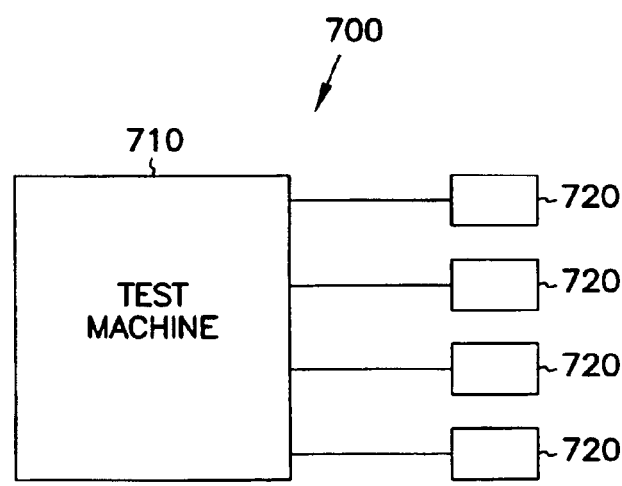
FIG. 7 is a block diagran of a system for testing memory devices according to an embodient of the present invention.

A system 700 for testing memory devices according to an embodiment of the present invention is shown in FIG. 7. The system 700 includes a test machine 710 and four memory devices 720 each coupled to the test machine 710 to be tested at the same time. The circuitry shown in FIGS. 24 may be located in the test machine 710 or in each of the memory devices 720. In an alternative embodiment of the present invention the method 500 may be implemented as a series of programmable instructions stored and implemented in the test machine 710.

FIG. 8 is a block diagram of an information handling system 800 according to another embodiment of the present invention The system 800 includes a processor 810, a display unit 820, an input/output (I/O) device 830, and a memory device 840. The processor 810, the display unit 820, the input/output (I/O) device 830, and the memory device 840 are coupled together by a suitable communication line or bus 850. The memory device 840 may include any of the embodiments of the present invention described above which one skilled in the art will appreciate may be employed with any type of memory device having an array of memory cells. Examples of such memory devices include a random-access memory (RAM) such as a dynamic random-access memory (DRAM), a SDRAM, a SGRAM, a static random-access memory (SRAM), or a read-only memory (ROM). The I/O device 830 may be a pointing device such as a mouse, a keyboard, a modem, or any other type of device that transfers data to and from a processor-based system. The display unit 820 may be a monitor. In various embodiments, the information-handling system 800 is a computer system (such as, for example, a video game, a handheld calculator, a personal computer, or a multiprocessor supercomputer), an infornation appliance (such as, for example, a cellular telephone, a pager, or a daily planner or organizer), an infonnation component (such as, for example, a imagnetic disk drive or telecommunications modem), or other appliance (such as, for example, a hearing aid, washing machine or microwave oven having an electronic controller).

The embodiments of the present invention described above provide for a test of a memory device in a faster manner than is presently known or used Read data values for a test are compressed into a set of signsthat are combined in a DDR circuit to be read together at a single output. The set of signals, output on sequential edges of a clock signal, indicate the three possible results of a test of the memory device without requiring that an output pinbe tri-stated to indicate one of the results. Those skilled in the art will understand that a significant amount of time is required to bring an output buffer to the tri-state condition, and therefore a memory device may be tested much more rapidly according to the embodiments of the invention. AU components of the embodiments of the invention described above may be in the memory device, or some or all of the components may be external to the memory device.

Although specific embodiments have been illustrated and described herein, it will be appreciated by those of ordinary skill in the art that any arrangement which is claculated the same purpose may be substituted for the specific embodiments shown. This application is intended to cover any adaptations or variations of the present invention. It is manifestly intended that this invention be limited only by the following claims and equivalents thereof.

What is claimed is:

1. A circuit comprising:
   a compression circuit coupled to receive data values from a plurality of cells in a memory device and being structured to generate first and second compressed data signals based on the data values, the first and second compressed data signals being equal to the data values if the data values are all the same and the first and second compressed data signals being different if the data values are not the same; and
   a double data rate circuit coupled to the compression circuit to receive the first and second compressed data signals and to a clock signal source to receive a clock signal, the double data rate circuit being structured to produce the first compressed data signal during a leading edge of the clock signal and to produce the second compressed data signal during a trailing edge of the clock signal within each cycle of the clock signal.

2. The circuit of claim 1 wherein the compression circuit comprises:
   a plurality of pull-up transistors coupled to intermediate nodes and structured to bring the intermediate nodes to a high voltage;
   a plurality of pull-down transistors coupled between data latches structured to latch the data values and the intermediate nodes, the pull-down transistors being structured to generate intermediate signals at the intermediate nodes based on the data values; and
   a logic circuit coupled between the intermediate nodes and the double data rate circuit, the logic circuit being structured to generate the first and second compressed data signals based on the intermediate signals.

3. A circuit comprising:
   a compression circuit having a plurality of inputs each coupled to receive a data signal and a plurality of compression outputs, the compression outputs being fewer than the inputs, the compression circuit being structured to generate first and second signals at first and second compression outputs based on the data signals, the first and second signals being equal to the data signals if the data signals are all the same and the first and second signals being different if the data signals are not the same; and
   a double data rate circuit coupled to the compression circuit to receive the first and second signals and to a clock signal source to receive a clock signal, the double data rate circuit being structured to produce the first signal during a leading edge of the clock signal and to produce the second signal during a trailing edge of the clock signal within each cycle of the clock signal.

4. The circuit of claim 3, further comprising:
   a plurality of latch circuits, each latch circuit having an input coupled to a read data path to receive a respective one of the data signals from a memory cell in a memory device and having a pair of inverters each having an output connected to an input of the other inverter to hold the data signal, the latch circuits being coupled together to the compression circuit; and
   the inputs of tbe compression circuit are coupled to the latch circuits to receive the data signals.

5. The circuit of claim 4 wherein the compression circuit comprises:
   a plurality of pull-up transistors coupled to intrmediate nodes and structured to bring the intermediate nodes to a high voltage;
   a plurality of pull-down transistors coupled between the latch circuits and the intermediate nodes, the pull-down transistors being structured to generate intermediate signals at the intermediate nodes based on data signals; and
   a logic circuit coupled between the intermediate nodes and the double data rate circuit, the logic circuit being structured to generate the first and second signals based on the intermediate signals.

6. A A memory device comprising:
   a plurality of cells;
   a compression circuit coupled to receive data values from the cells and being structured to generate first and second compressed data signals based on the data values, the first and second compressed data signals being equal to the data values if the data values are all the same and the first and second compressed data signals being different if the data values are not the same; and
   a double data rate circuit coupled to the compression circuit to receive the first and second compressed data signals and to a clock signal source to receive a clock signal, the double data rate circuit being structured to produce the first compressed data signal during a leading edge of the clock signal and to produce the second compressed data signal during a trailing edge of the clock signal within each cycle of thc clock signal.

7. The memory device of claim 6, further comprising:
   addressing circuitry;
   control lines;
   address lines; and
   data lines.

8. The memory device of claim 7 wherein the compression circuit comprises:
   a plurality of data latches, each data latch having an input coupled to a read data path to receive a data value read from one of the cells and a pair of inverters coupled to receive the data value, each inverter having an output connected to an input of the other inverter to hold the data value;
   a plurality of pull-up transistors coupled to intermediate nodes and structured to bring the intermediate nodes to a high voltage;
   a plurality of pull-down transistors coupled between the data latches and the intermediate nodes, the pull-down transistors being structured to generate intermediate signals at the intermediate nodes based on the data values;
   a logic circuit coupled between the intermediate nodes and the double data rate circuit, the logic circuit being structured to generate the first and second compressed data signals based on the intermediate signals.

9. A system comprising:
   a processor;
   a memeory device having a plurality of cells; and
   a test circuit comprising:
      a compressin circuit coupled to receive data values from the cells and being structured to generate first and second signals at first and second compression outputs based on the data values, the first and second signals being equal to the data values if the data values are all the same and the first and second signals being different if the data values are not the same; and a double data rate circuit coupled to the compression circuit to receive the first and second signals and to a clock signal source to receive a clock signal, the double data rate circuit being structured to produce the first signal during a leading edge of the clock signal and to produce the second signal during a trailng edge of the clock signal within each cycle of the clock signal.

10. The system of claim 9, further comprising:

an input/output device; and a bus connected to the processor, the memory device, and the input/output device.

11. The system of claim 9, further comprising:

a test machine including the processor; 'a write circuit;

a read and data compression ciruit including the test circuit; and whereiin the test machine, the write circuit, the read and data compression circuit, and the memory device are connected togetber by communication lines.

12. A system comprising:

a processor; and a memory device having a plurality of cells and being conected to the processor, the memory device having an internal test circuit comprising:

a compression circuit coulped to receive data values from the cells and being structured to generate first and second signals at first and second compression outputs based on the data values, the first and second signals being equal to the data values if the data values are all the same and the first and second signals being different if the data values are not the same; and a double data rate circuit coupled to the compression circuit to receive the first and second signals and to a clock signal source to receive a clock signal, the double data rate circuit being structured to produce the first signal during a leading edge of the clock signal and to produce the second signal during a trailing edge of the clock signal within each cycle of the clock signal.

13. The system of claim 12, further comprising:

a display unit;

an input/output device; and a bus coupling the processor, the memory device, the display unit, and the input/output device.

14. The system of claim 13 wherein the system comprises a computer system, an information component, or an appliance.

15. A test system comprising:

a test machine;

a memory device having a plurality of cells and being coupled to the test machine to be tested; and a test circuitry comprising:

a compression circuit coupled to receive data signals from the cells and being structured to generate first and second signals at first and second compression outputs based on the data signals, the first and second signals being equal to the data signals if the data signals are all the same and the first and second signals being different if the data signals are not the same; and a double data rate ciruit coupled to the compression circuit to receive the first and second signals and to a clock signal source to receive a clock signal, the double data rate circuit being structured to produce the first signal during a leading edge of the clock signal and to produce the second signal during a trailing edge of the clock signal within each cycle of the clock signal.

16. The system of claim 15, further comprising a plurality of memory devices each having a plurality of cells, each of the memory devices being coupled to the test machine to be tested.

17. The system of claim 15 wherein the test circuitry is located in the memory device.

18. The system of claim 15 wherein the test circuitry is located in the test machine.

19. The system of claim 15 wherein the test circuitry is located between the test machine and the memory device.

20. A double data rate memory device comprising:

a plurality of cells;

a compression circuit coupled to receive data values from the cells and being structured to generate first and second compressed data signals based on the data values, the first and second compressed data signals being equal to the data values if the data values are all the same and the first and second compressed data signals being different if the data values are not the same; and a double data rate circuit coupled to the compression circuit to receive the first and second compressed data signals and to a clock signal source to receive a clock signal, to double data rate circuit being structured to produce the first compressed data signal during a leading edge of the clock signal and to produce the the second compressed data signal during a trailing edge of the clock signal within each cycle of the clock signal.

21. The memory device of claim 20, further comprising:

addressing circuity;

control lines;

address lines;

data lines; and a plurality of data latches, each data latch having an input coupled to a read data path to receive a data value read from one of the cells and a pair of inventors coupled to receive the data value, each inverter having an output connected to an input of the other inverter to hold the data value, the data latches being coupled together to the compression circuit.

22. The memory device of claim 21 wherein the compression circuit comprises:

a plurality of pull-up transistors coupled to intermediate nodes and structured to bring the intermdiate nodes to a high voltage, a plurality of pull-down transistors coupled between the data latches and the intermediate nodes, the pull-down transistors being structured to generate intermediate signals at the intermediate nodes based on the data values;

a logic circuit coupled between the intermediate nodes and the double data rate circuit, the logic circuit being structured to generate the first and second compressed data signals based on the intermediate signals.

23. A memory device comprising:

a plurality of memory cells;

means for compressing a plurality of data values read from selected ones of the memory cells into first and second compressed data signals, the first and second compressed data signals being equal to the data values if the data values are all the same and the first and second compressed data signals being different if the data values are not the same; and means for producing the first compressed data signal during a leading edge of a clock signal and the second compressed data signal during a trailing edge of the clock signal within each cycle of the clock signal.

24. A method for testing a memory device comprising:

writing data to cells in the memory device;

reading the cells to generate read data;

compressing the read data into first and second compressed data signals, the first and second compressed data signals being equal to the read data if all the read data are the same and the first and second compressed data signals being different if all the read data are not the same; and coupling the first compressed data signal to a single output on a rising edge of a clock signal and coupling the second compressed data signal to the single output on a falling edge of the clock signal through a double data rate circuit.

25. The method of claim 24, further comprising analyzing the first and second compressed data signals at the single output to determine that the cells store data properly if the first and second compressed data signals are the same and to determine that the cells do not store data properly if the first and second compressed data signals are not the same.

26. A method for testing a plurality of memory devices comprising:

writing data to cells in each memory device;

reading the cells to generate read data;

for each memory device, generating first and second compressed data signals to be equal to the read data of the memory device if all the read data from the memory device are the same and generating the first and second compressed data signals to be different if all the read data from the memory device are not the same; and for each memory device, coupling the first compressed data signal to a single output on a rising edge of a clock signal and the second compressed data signal to the single output on a falling edge of the clock signal through a double data rate circuit.

27. The method of claim 26, further comprising analyzing the first and second compressed data signals for each memory device at the single output to determine that the cells in the memory device store data properly if the first and second compressed data signals are the same and to determine that the cells in the memory device do not store data properly if the first and second compressed data signals are not the same.

28. A method for operating an integrated circuit test machine comprising:

writing a test data value to selected cells in each of a plurality of memory devices;

reading the selected cells to generate read data for each memory device;

for each memory device, generating first and second compression signals to be equal to the read data if all the read data are the same and generating the first and second compression signals to be different if all the read data are not the same;

for each memory device, coupling the first compression signal to a single output on a rising edge of a clock signal and the second compression signal to the signle output on a falling edge of the clock signal through a double data rate circuit; and analyzing the first and second compression signals at each output to determine if the selected cells in each memory device have stored the test data value properly.

29. The method of claim 28 wherein analyzing the first and second compression signals comprises analyzing the first and second compression signals at each output to determine that the selected cells stored the test data value properly if the first and second compression signals are the same and to determine that the selected cells did not store the test data value properly if the first and second compression signals are not the same.

30. A method for testing a memory device comprising:

selecting a plurality of test cells from cells in the memory device;

writing a test data value to each of the selected cells;

reading each selected cell to generate a plurality of read data values;

latching the read data values;

compressing the read data values into two intermediate data values;

converting the intermediate data values into first and second compressed data values, the first and second compressed data values being equal to the read data values if the read data values are all the same, the first and second compressed data values being different if the read data values are not all the same;

generating a clock signal;

producing the first compressed data value at an output on a rising edge in a single period of the clock signal through a double data rate circuit;

producing the second compressed data value at the output on a falling edge in the single period of the clock signal through the double data rate circuit; and analyzing the first and second compressed data values at the output to determine that the cells in the memory device stored the test data value properly if the first and second compressed data values are equal.

31. A method for testing a double data rate memory device comprising:

writing data to cells in the memory device;

reading the cells to generate read data;

generating first and second compressed data signals to be equal to the read data if all the read data are the same and generating the first and second compressed data signals to be different if all the read data are not the same; and coupling the first compressed data signal to an output of a double data rate circuit on a rising edge of a clock signal and coupling the second compressed data signal to the output of the double data rate circuit on a falling edge of the clock signal.

32. The method of claim 31, further comprising analyzing the first and second compressed data signals at the output of the double data rate circuit to determine that the cells in the memory device store data properly if the first and second compressed data signals are the same and to determine that the cells in the memory device do not store data properly if the first and second compressed data signals are not the same.

* * * * *

UNITED STATES PATENT AND TRADEMARK OFFICE
CERTIFICATE OF CORRECTION

PATENT NO. : 6,976,195 B1
DATED : December 13, 2005
INVENTOR(S) : Seyyedy et al.

It is certified that error appears in the above-identified patent and that said Letters Patent is hereby corrected as shown below:

Column 1,
Line 26, after "columns" insert -- . --.
Line 28, after "If" delete "a".
Line 34, delete "consuning" and insert -- consuming --.
Line 52, delete "consumng" and insert -- consuming --.
Line 65, delete "sldlled" and insert -- skilled --.
Line 65, delete "examinaton" and insert -- examination --.

Column 2,
Line 3, delete "pesent" and insert -- present --.
Line 18, delete "diagran" and insert -- diagram --.
Line 19, delete "embodient" and insert -- embodiment --.
Line 45, delete "nonconductive" and insert -- non-conductive --.
Line 47, delete "opera(ed" and insert -- operated --.
Line 51, delete "amay" and insert -- array --.
Line 55, after "the" delete ",".

Column 3,
Line 17, delete "subarmys" and insert -- subarrays --.

Column 4,
Line 2, delete "DRTI" and insert -- DRTi --.
Line 3, delete "successfudly" and insert -- successfully --.
Line 4, delete "dat" and insert -- data --.
Line 19, delete "ame" and insert -- are --.
Line 24, delete "SDRAM(SGRAM" and insert -- SDRAM/SGRAM --.
Line 37, delete "electrcal" and insert -- electrical --.
Line 56, delete "rcontrol" and insert -- control --.
Line 67, delete "carying" and insert -- carrying --.

Column 5,
Line 21, delete "mad" and insert -- read --.
Line 61, delete "Ihe" and insert -- The --.
Line 66, after "following" delete ";" and insert -- : --.

Column 6,
Line 2, delete "Ondy" and insert -- Only --.
Line 9, delete "24" and insert -- 2-4 --.
Line 17, after "invention" insert -- . --.
Line 37, delete "infornation" and insert -- information --.
Line 39, delete "infonnation" and insert -- information --.

UNITED STATES PATENT AND TRADEMARK OFFICE
CERTIFICATE OF CORRECTION

PATENT NO.     : 6,976,195 B1
DATED          : December 13, 2005
INVENTOR(S)    : Seyyedy et al.

It is certified that error appears in the above-identified patent and that said Letters Patent is hereby corrected as shown below:

Column 6 (cont'd),
Line 40, delete "imagnetic" and insert -- magnetic --.
Line 46, after "used" insert -- . --.
Line 47, delete "signsthat" and insert -- signals that --.
Line 51, delete "pinbe" and insert -- pin be --.
Line 56, delete "AU" and insert -- All --.
Line 62, delete "claculated" and insert -- calculated to achieve --.

Column 7,
Line 61, delete "tbe" and insert -- the --.
Line 65, delete "intrmediate" and insert -- intermediate --.

Column 8,
Line 4, after "on" insert -- the --.
Line 10, after "A" delete "A".
Line 28, delete "thc" and insert -- the --.
Line 57, delete "memeory" and insert -- memory --.
Line 60, delete "compressin" and insert -- compression --.

Column 9,
Line 7, delete "trailng" and insert -- trailing --.
Line 14, delete "'a" and insert -- a --.
Lines 16 and 64, delete "ciruit" and insert -- circuit --.
Line 18, delete "whereiin" and insert -- wherein --.
Line 20, delete "togetber" and insert -- together --.
Line 24, delete "conected" and insert -- connected --.
Line 26, delete "coulped" and insert -- coupled --.
Line 55, delete "a" before "test".

Column 10,
Line 29, delete first occurrance of "to" and insert -- the --.
Line 31, after "produce the" delete "the".
Line 35, delete "circuity;" and insert -- circuitry; --.
Line 41, delete "inventors" and insert -- inverters --.
Line 49, delete "intermdiate" and insert -- intermediate --.
Line 50, after "voltage" delete "," and insert -- ; --.

UNITED STATES PATENT AND TRADEMARK OFFICE
CERTIFICATE OF CORRECTION

PATENT NO. : 6,976,195 B1
DATED : December 13, 2005
INVENTOR(S) : Seyyedy et al.

It is certified that error appears in the above-identified patent and that said Letters Patent is hereby corrected as shown below:

<u>Column 11,</u>
Line 15, delete "signaIs" and insert -- signals --.
Line 66, delete "signle" and insert -- single --.

Signed and Sealed this

Ninth Day of May, 2006

JON W. DUDAS
*Director of the United States Patent and Trademark Office*